United States Patent [19]

Frommeld et al.

[11] Patent Number: 4,940,647
[45] Date of Patent: Jul. 10, 1990

[54] PHOTOPOLYMERIZABLE COMPOSITIONS A LEUCO DYE AND A LEUCO DYE STABILIZER

[75] Inventors: Hans-Dieter Frommeld, Wiesbaden; Hartmut Wiezer, Eppstein, both of Fed. Rep. of Germany

[73] Assignee: Hoechst Aktiengesellschaft, Frankfurt am Main, Fed. Rep. of Germany

[21] Appl. No.: 254,240

[22] Filed: Oct. 6, 1988

[30] Foreign Application Priority Data

Oct. 16, 1987 [DE] Fed. Rep. of Germany ....... 3735088

[51] Int. Cl.$^5$ ............................................... G03C 1/76
[52] U.S. Cl. ................................. 430/271; 430/275; 430/277; 430/278; 430/279; 430/280; 430/281; 430/915; 430/916; 430/917; 522/12; 522/16; 522/23
[58] Field of Search ............... 430/915, 916, 917, 281, 430/338, 372, 270, 200, 271, 277, 278, 279, 275; 522/16, 12, 23

[56] References Cited

U.S. PATENT DOCUMENTS

| | | | |
|---|---|---|---|
| 2,760,863 | 8/1956 | Plambeck, Jr. ........................ | 95/5.6 |
| 3,042,575 | 7/1962 | Hartler ................................... | 162/80 |
| 3,060,023 | 10/1962 | Burg et al. ............................. | 96/28 |
| 3,697,280 | 10/1972 | Strilko .................................. | 430/281 |
| 4,171,977 | 10/1979 | Hasegawa et al. .................... | 430/917 |
| 4,271,251 | 6/1981 | Aotani et al. ......................... | 430/195 |
| 4,485,166 | 11/1984 | Herwig et al. ....................... | 430/260 |
| 4,598,036 | 7/1986 | Iwasaki et al. ....................... | 430/270 |
| 4,632,897 | 12/1986 | Barzynski et al. ................... | 430/260 |
| 4,766,055 | 8/1988 | Kawabata et al. ................... | 430/281 |

FOREIGN PATENT DOCUMENTS 0230941 8/1987 European Pat. Off. .
3534527 4/1986 Fed. Rep. of Germany .

*Primary Examiner*—Paul R. Michl
*Assistant Examiner*—Christopher D. Rodee
*Attorney, Agent, or Firm*—Foley & Lardner, Schwartz, Jeffery, Schwaab, Mack, Blumenthal & Evans

[57] ABSTRACT

The invention comprises a photopolymerizable mixture comprising as the essential constituents a polymeric binder, a compound capable of forming a polymer by free-radical initiated polymerization, a photoinitiator, a leuco dye and a leuco dye stabilizer having at least one epoxy group. The mixture has a better shelf life in the dark than known compositions and is preferably used in the preparation of dry photoresists.

27 Claims, No Drawings

PHOTOPOLYMERIZABLE COMPOSITIONS A LEUCO DYE AND A LEUCO DYE STABILIZER

BACKGROUND OF THE INVENTION

The present invention relates to a photopolymerizable mixture or composition containing a polymeric binder, a polymerizable compound, a photoinitiator and a leuco dye.

Mixtures of the above-indicated composition are known in the art. The addition of a leuco dye has the effect that, after exposure, the mixture exhibits a visible contrast between exposed and unexposed areas, since leuco dyes are oxidized during or after exposure to form the corresponding dyes. Mixtures of this kind are described, for example in German Offenlegungsschrift No. 31 31 448 and in European Patent Application No. 230 941.

Due to the fact that leuco dyes are slowly oxidized even in the dark, these mixtures tend to discolor during dark storage. This tendency is increased when photooxidizing agents, for example, trihalogenomethyl compounds which split off halogen radicals upon exposure, are added to obtain an intensification of contrast. A number of stabilizers, for example, sulfur compounds, phenols and other reducing agents have therefore been recommended for photopolymerizable mixtures and materials of this kind.

German Offenlegungsschrift No. 35 34 527 describes thiuram disulfide for use as a stabilizer. Similarly to thiourea, thiuram disulfide is a moderate stabilizing agent. These compounds, however, have the disadvantage of reacting with a copper surface, which gives rise to annealing tints, staining upon exposure and problems in subsequent electroplating processes. In addition, light sensitivity is reduced by thiuram disulfides.

U.S. Pat. No. 3,042,515 mentions stabilizers comprising phenols, such as resorcinol or hydroquinone. In most cases, however, the effect of these compounds is inadequate.

German Offenlegungsschrift No. 29 41 846 describes 2,4-dihydroxybenzaldoxime as a reducing stabilizer, which has an improved stabilizing action. But even when this compound is added, shelf life is still insufficient and, in addition, the adhesion of the layer to copper is impaired.

European Patent No. 63 304 teaches addition of particular epoxy compounds to photopolymerizable mixtures for thermal post-hardening. Since these compounds act as crosslinking agents they must necessarily contain two epoxy groups. They are also added in relatively large amounts of 1.5 to 10, preferably 2 to 6, percent by weight.

U.S. Pat. No. 4,146,453 describes a photopolymerizable composition comprising ethylenically unsaturated compounds and certain particularly active photoinitiators, e.g., benzoin or benzoin derivatives. With respect to these particularly active photoinitiators, the composition is stabilized against premature polymerization by the addition of certain epoxy compounds. Moreover, U.S. Pat. No. 4,171,977 discloses the use of certain epoxy compounds as thermal stabilizers to inhibit premature polymerization in a photopolymerizable composition. Neither of these, however, address the problem of leuco dye stabilization.

SUMMARY OF THE INVENTION

It is therefore an object of the present invention to provide a photopolymerizable composition, yielding a good color contrast upon exposure, which is stabilized against dark-storage discoloration in the presence of dyestuff leuco bases.

Another object of the present invention is to provide a stable photopolymerizable composition which is highly light-sensitive.

A further object of the present invention is to provide a stable photopolymerizable composition which adheres well to metal surfaces, in particular copper surfaces.

Still another object of the present invention is to provide a photopolymerizable recording material which is highly light-sensitive.

In accomplishing the foregoing objects, there has been provided, in accordance with one aspect of the present invention, a photopolymerizable composition comprising (a) a polymeric binder, (b) a compound having at least one terminal ethylenic double bond and a boiling point above 100° C. at standard pressure and being capable of forming a polymer by free-radical initiated polymerization, (c) a photoinitiator, (d) a leuco dye and (e) a leuco dye stabilizer comprising a compound having at least one epoxy group.

In accordance with another aspect of the present invention, a photopolymerizable recording material has been provided that comprises a support and a photopolymerizable layer comprised of the above-described composition. In a preferred embodiment, the support comprises a transparent plastic film.

Other objects, features and advantages of the present invention will become apparent to those skilled in the art from the following detailed description of preferred embodiments. It should be understood, however, that the detailed description and the specific examples, while indicating preferred embodiments of the invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The epoxy compounds should be non-volatile or practically non-volatile. The molecular weight of the epoxy compounds, however, preferably should not be higher than about 600, in particular no higher than about 400. Suitable compounds include epoxyalkyl ethers such as glycidyl ethers of aliphatic and aromatic compounds, for example, the mono- or diglycidyl ether of 2,2-bis-(4-hydroxyphenyl)propane, phenyl glycidyl ether, tert-butylphenyl glycidyl ether, p-methoxyphenyl glycidyl ether, and 2-ethylhexyl glycidyl ether. Preference is given to monoepoxides and also to compounds having at least one aromatic ring, e.g., styrene oxide and aryl glycidyl ethers. The epoxides are preferably added in quantities of 0.05 to 2.0 percent by weight, based on the non-volatile constituents of the mixture.

Preferred leuco dyes are those of the triphenylmethane or xanthene series. Examples of these are the leuco bases of crystal violet, Victoria Blue BH, Victoria Pure Blue BOH, methyl violet, fuchsin, malachite green, Acid Violet 5B, Solar Cyanine 6B, brilliant green and Acilane Violet S. Particularly preferred are tris-(p- dimethylaminophenyl)methane, tris-(p-diethylaminophenyl)methane, tris-(p-dipropylaminophenyl)methane and 3,6-bis-diethylamino-9-phenyl-xanthene.

Photoinitiators which may be used include benzophenone, Michler's ketone, thioxanthone, p-dialkylaminobenzoic acid ester and preferably heterocyclic compounds having 2 to 5 aromatic rings and at least one nitrogen atom as the heteroatom, in particular acridine, phenazine and quinoline derivatives.

Compounds which may be mentioned include: 9-(4'-tolyl)-acridine, 9-(4'-methoxyphenyl)acridine, 9-(4'-hydroxyphenyl)-acridine, 9-acetylamino-acridine, 9,10-dimethyl-benz[a]phenazine, 10-methyl-benz[a]phenazine, 9-methoxybenz[a]phenazine, 10-methoxy-benz[a]phenazine, dibenz[a,c]phenazine, 11-methoxy-dibenz-[a,c]phenazine, dibenz[a,j]-phenazine, in particular 9-phenylacridine, 9-(4'-t-butylphenyl)acridine, benz[a]phenazine, 9-methyl-benz[a]phenazine, 2-styryl-quinoline, cinnamylidenequinaldine, and 3-(o-chloro-benzylidene)-9-phenyl-2,3-dihydro-1H-cyclopenta[b]quinoline.

The quantity of initiator generally ranges from about 0.01 to 10, preferably from about 0.05 to 4, percent by weight, based on the non-volatile constituents of the mixture.

Preferably, the mixture also contains a photooxidizing agent, in particular a compound having at least one trihalogenomethyl substituent or a dihalogenated methylene group in its molecule.

Of these compounds tribromomethylphenylsulfone, 2,2-dibromomalonic diamide, $\alpha,\alpha$-dibromo-$\alpha$-cyanomethylphenylsulfone, $\alpha,\alpha$-dibromo-$\alpha$-benzoylmethylphenylsulfone, $\alpha,\alpha$-dibromomalonic-bis-N-methylamide, 4,6-bis(trichloromethyl)-s-triazines or 2-tribromomethylquinoline can, in particular, be used; of the 4,6-bis(-trichloromethyl)-s-triazines the derivatives substituted in the 2-position are preferably employed. The preferred substituents are methyl-, ethyl-, phenyl-, 4-methoxyphenyl- or 4'-styrylphenyl-. Tribromomethylphenylsulfone is particularly preferred. The photooxidizing agent is preferably used in a quantity of 0.01 to 2 percent by weight.

Polymerizable compounds useful for the purposes of the invention are known and are described, for example, in U.S. Pat. Nos. 2,760,863 and 3,060,023.

Preferred examples are acrylic and methacrylic acid esters of dihydric or polyhydric alcohols, such as ethylene glycol diacrylate, polyethylene glycol dimethacrylate, acrylates and methacrylates of trimethylol ethane, trimethylol propane, pentaerythritol and dipentaerythritol, and of polyhydric alicyclic alcohols or N-substituted acrylic and methacrylic acid amides. Reaction products of mono- or diisocyanates with partial esters of polyhydric alcohols are also used advantageously. Monomers of this kind are described in German Offenlegungsschriften Nos. 20 64 079, 23 61 041 and 28 22 190.

The proportion of monomers contained in the layer generally varies between about 10 and 80, preferably between about 20 and 60, percent by weight.

A large number of soluble organic polymers can be employed as binders. Examples are: polyamides, polyvinyl esters, polyvinyl acetals, polyvinyl ethers, epoxide resins, polyacrylic acid esters, polymethacrylic acid esters, polyesters, alkyd resins, polyacrylamide, polyvinyl alcohol, polyethylene oxide, polydimethyl acrylamide, polyvinyl pyrrolidone, polyvinylmethyl formamide, polyvinylmethyl acetamide, and copolymers of the monomers which form the enumerated homopolymers.

With particular advantage, binders are used that are insoluble in water but that are soluble, or at least swellable in aqueous-alkaline solutions, since layers containing such binders can be developed with the preferably employed aqueous-alkaline developers. Binders of this type can, for instance, contain the following groups: —COOH, —PO$_3$H$_2$, —SO$_3$H, —SO$_2$NH—, —SO$_2$—NH—SO$_2$—, and —SO$_2$—NH—CO—.

Examples of these binders are: maleate resins, polymers of $\beta$-methacryloyloxy-ethyl-N-(p-tolylsulfonyl)-carbamate and copolymers of these and similar monomers with other monomers, vinyl acetate/crotonic acid copolymers and styrene/maleic acid anhydride copolymers. Copolymers of alkyl(meth)acrylates and methacrylic acid and copolymers of methacrylic acid, higher alkyl(meth)acrylates and methyl methacrylate and/or styrene, acrylonitrile, and the like, which are described in German Offenlegungsschriften Nos. 20 64 080 and 23 63 806, are preferably used.

In general, the quantity of binder added ranges from about 20 to 90, preferably from about 40 to 80, percent by weight of the layer constituents.

Depending on their intended use and desired properties, the photopolymerizable mixtures can contain various additional substances. Examples of these admixtures are: adhesion promoters, inhibitors to prevent thermal polymerization of monomers, hydrogen donors, substances that modify the sensitometric properties of layers of this type, dyes, colored and uncolored pigments, plasticizers such as polyglycols or esters of p-hydroxylbenzoic acid.

Suitable additional substances are, for examples, sulfur compounds, such as mercaptobenzimidazole, mercaptobenzothiazole, imidazole or imidazole derivatives, compounds containing a trivalent phosphorus, such as triphenylphosphine or triphenylphosphite.

These constituents advantageously should be selected to minimize absorption in the region of actinic radiation, which is important for the initiation process.

The photopolymerizable mixture of the present invention can be used in various applications, such as in the production of varnishes which are hardened by the action of light and, in particular, in a light-sensitive recording material used for reproduction purposes.

Although the present description focuses on this last field of application, the present invention is not limited thereto. Examples of applications for the present invention in the reproduction field are: recording layers for the photomechanical production of printing plates suitable for letterpress printing, lithographic printing, gravure printing, or screen printing, relief copies, for example, in the production of Braille books, single copies, tanned images, pigment images, etc. The mixtures of the present invention can also be employed for the photomechanical production of etch resists, for example, for name plates, printed circuits, and chemical milling. The mixtures of this invention are of particular importance with regard to the photoresist technology, in particular for use as dry photoresist materials.

The mixture within the present invention can be used industrially for the above-mentioned applications as a liquid solution or dispersion, for example, a photoresist solution, which is applied by the consumer to an individual support, for example, for chemical milling, for the production of printed circuits, screen printing stencils, etc. The mixture can also be present as a solid light-sensitive layer coated on a suitable support, i.e., as a storable, presensitized photosensitive copying material, for example, for the production of printing plates. It can also be employed for the production of dry resists.

Layer supports which are suitable for recording materials prepared using the mixture of the present invention include, for example, copper, aluminum, steel, zinc, plastic films, such as films of polyethylene terephthalate or cellulose acetate, and screen printing supports, such as perlon gauze.

The light-sensitive materials employing the mixture of this invention are conventionally prepared.

Thus, the mixture oan be taken up in a solvent, and the resulting solution or dispersion can be applied to the intended support as a film by casting, spraying, immersion, roller application, etc., and subsequently dried. Thick layers (for example, of 250 μm and thicker) are advantageously prepared by first producing a self-supporting film by extrusion or molding, which is then optionally laminated to the support. In the case of dry resists, solutions of the mixture are applied to transparent supports and prebaked. The light-sensitive layers, having a thickness between about 10 and 100 μm, are then also bonded to the desired support by lamination, along with the temporary support.

The materials are processed using known methods. Images are produced by exposure to actinic radiation. Within the scope of the present description, actinic radiation refers to any radiation, the energy of which corresponds at least to that of short-wave visible light. Long-wave uv-radiation can be used and also laser radiation. The materials are developed by treatment with an appropriate developer solution, for example, a solution of organic solvents, but preferably with a weakly alkaline aqueous solution, whereby the unexposed areas of the layer are removed, while the exposed areas of the photopolymerizable layer remain on the support.

The following examples illustrate preferred embodiments of the present invention. Quantitative ratios and percentages are to be understood as weight units. The amounts of the individual constituents are expressed in parts by weight (pbw).

EXAMPLE 1

The following solutions 1a to 1l were prepared using, in each case, a base solution comprising:
  50 pbw of the reaction product obtained from 1 mol of 2,2,4-trimethylhexamethylenediisocyanate and 2 mols of 2-hydroxyethylmethacrylate,
  50 pbw of a terpolymer of styrene, n-hexylmethacrylate and methacrylic acid (10:60:30) having an acid number of 190,
  0.05 pbw of Victoria Pure Blue FGA (C.I. Basic Blue 81),
  0.2 pbw of phenyl-tribromomethylsulfone,
  0.9 pbw of leuco crystal violet, and
  0.35 pbw of 9-phenylacridine in
  100 pbw of butanone, and
  20 pbw of ethanol
and adding the following constituents to this base solution:
  1a (C): no addition
  1b (C): 0.5 pbw of resorcinol
  1c (C): 0.5 pbw of hydroquinone
  1d (C): 0.5 pbw of thiourea
  1e (C): 0.5 pbw of tetramethylthiuram disulfide
  1f (C): 0.5 pbw of diacetyldioxime
  1g (C): 0.5 pbw of 2,4-dihydroxy-benzaldoxime
  1h (C): 0.5 pbw of ascorbic acid
  1i:  0.5 pbw of 2,2-bis-(p-hydroxyphenyl)-propanemono-2,3-epoxypropyl ether
  1k: 0.5 pbw of 2,3-epoxypropyl-p-t-butylphenyl ether
  1l: 0.5 pbw of 2,3-epoxypropyl-2′-ethylhexyl ether
  C=Comparison test Each of these solutions was applied to a 25 μm thick polyethylene terephthalate film and subsequently dried for 2 minutes in a drying oven at 100° C. The dry resist layers obtained had a layer weight of 45 g/m².

To protect the dry resist layers from dust and mechanical damage they were covered with a 20 μm thick cover film of polyethylene, which had a lower adhesion to the photopolymerizable layer than the polyester film.

The shelf life of the layers was determined after storing them for 10 days at 40° C. A Hunterlab-Colorimeter was used to measure the reflectance-brightnesses before and after storage. The L-value is a measure of brightness (100=ideal white, 0=ideal black). L-values relating to the individual mixtures are compiled in Table 1.

Light-sensitivity and adhesion were determined after peeling off the cover film and laminating each dry resist layer, with the aid of a commercial laminator, at 120° C. and at a rate of 1.5 m/minute, to a pre-cleaned copper foil laminated to an epoxy-fiberglass laminate.

Samples 1a to 1l of the resists laminated to the copper surface were then exposed through the support film under an original provided with a line pattern and a 13-step continuous-tone step wedge having density increments of 0.15. Each sample was exposed for 5 seconds using an iron-doped 5 kW metal halide lamp arranged at a distance of 90 cm.

After removing the support film the exposed plates were spray-developed with an 0.8% strength sodium carbonate solution at 25° C. The developing time was about 60 seconds in each case.

The number of completely hardened steps is given in the table below.

An adhesion test was carried out on the unexposed layer laminated to a copper foil after peeling off the support film and cutting a crosshatch pattern into the resist layer. A commercial adhesive film was then pressed against the resist layer and pulled off with one jerk. The adhesion of a resist that could not be detached from the copper surface was marked +, that of a slightly detached resist 0 and that of a severely detached resist − (cf. Table).

The table shows that the known stabilizing agents either are not very effective or have other disadvantages. Samples i to l according to the invention exhibit optimum properties in view of stabilizing effect, light sensitivity and adhesion to copper.

TABLE 1

| Sample | L-value fresh | L-value after storage | ΔL | light sensitivity (number of hardened steps) | adhesion to copper |
| --- | --- | --- | --- | --- | --- |
| a | 63.0 | 40.2 | 22.8 | 6 | + |
| b | 64.0 | 58.3 | 5.7 | 6 | 0 |
| c | 63.5 | 49.3 | 14.2 | 5 | 0 |
| d | 64.0 | 60.8 | 3.2 | 7 | + |
| e | 64.0 | 61.2 | 2.8 | 2 | 0 |
| f | 64.0 | 58.6 | 5.4 | 6 | − |
| g | 64.0 | 62.8 | 1.2 | 6 | − |
| h | 63.6 | 51.0 | 12.6 | 7 | − |
| i | 64.0 | 63.6 | 0.4 | 6 | + |
| k | 64.0 | 63.7 | 0.3 | 6 | + |

TABLE 1-continued

| Sample | L-value fresh | L-value after storage | ΔL | light sensitivity (number of hardened steps) | adhesion to copper |
|---|---|---|---|---|---|
| 1 | 64.0 | 63.1 | 0.9 | 6 | + |

EXAMPLE 2

The following solutions 2a to 2e were prepared using, in each case, a base solution comprising:
- 54 pbw of a terpolymer or methyl methacrylate, n-hexylmethacrylate and methacrylic acid (5:60:35) having an acid number of 220,
- 23 pbw of the reaction product obtained from 1 mol of 2,2,4-trimethyl-hexamethylendiisocyanate and 2 mols of 2-hydroxyethyl methacrylate,
- 23 pbw of triethylene glycol diacrylate,
- 0.1 pbw of 1,4-bis(isopropylamino)anthraquinone,
- 0.5 pbw of 2,2-dibromomalonic acid diamide,
- 0.5 pbw of leuco crystal violet,
- 2.0 pbw of leuco malachite green, and
- 0.2 pbw of 3-p-acetoxy-benzylidene-9-phenyl-2,3-dihydro-1H-cyclopenta[b]-quinoline in
- 50 pbw of butanone, and
- 30 pbw of ethanol and adding the following constituents to this base solution:
- 2a no addition
- 2b 0.5 pbw of hydroquinone
- 2c 0.5 pbw of 2,4-dihydroxy-benzaldoxime
- 2d 0.5 pbw of 2,2-bis(p-hydroxyphenyl)propane-bis-2,3-epoxypropyl ether
- 2e 0.5 pbw of 4-methoxyphenyl-2,3-epoxypropyl ether

EXAMPLE 3

As in Example 2, the following solutions 3a to 3e were prepared using, in each case, a base solution comprising
- 60 pbw of a terpolymer of styrene, n-hexylmethacrylate and methacrylic acid (10:55:35) having an acid number of 220,
- 20 pbw of triethylene glycol diacrylate,
- 20 pbw of N-(isobutoxymethyl)methacrylamide,
- 0.2 pbw of Neozapon Blue 807 (C.I. 74.400),
- 0.2 pbw of cyano-dibromomethyl-phenylsulfone,
- 1.05 pbw of leuco malachite green, and
- 0.75 pbw of isopropylthioxanthone in
- 50 pbw of butanone, and
- 140 pbw of ethanol and adding the following constituents to this base solution:
- 3a no addition
- 3b 0.25 pbw of hydroquinone
- 3c 0.25 pbw of 2,4-dihydroxy-benzaldoxime
- 3d 0.25 pbw of phenyl-2,3-epoxypropyl ether
- 3e 0.25 pbw of t-butylphenyl-2,3-epoxypropyl ether The solutions of Examples 2 and 3 were applied to a 25 μm thick polyethylene terephthalate film and dried as described in Example 1 (layer weight 45 g/m2). The dry resist layers were then covered with a 20μm thick film of polyethylene.

After peeling off the cover film, a commercial laminator was used to laminate the dry resist layers at 120° C. and at a rate of 1.5 m/minute to a pre-cleaned copper foil laminated to an epoxy-fiberglass laminate.

Of layers 2a to 3e one sample each was stored for 7 days at 40° C. in the form of a dry resist film having a support film and a cover film and one sample each was stored for 2 days at 40° C. after laminating to copper. The reflectance-brightnesses were measured with a Hunterlab-Colorimeter prior to and after storage.

The following Table 2 shows the brightness drop (Δ L) of the individual layers:

TABLE 2

| Sample | ΔL on copper | ΔL of the film |
|---|---|---|
| 2a | 5 | 12 |
| 2b | 8 | 2.7 |
| 2c | 11 | 2.3 |
| 2d | 1.0 | 1.2 |
| 2e | 1.5 | 1.0 |
| 3a | 4 | 20 |
| 3b | 2.2 | 7 |
| 3c | 4.5 | 2.5 |
| 3d | 1.0 | 2.0 |
| 3e | 0.8 | 2.0 |

EXAMPLE 4

A coating solution comprising:
- 5 pbw of a copolymer of methyl methacrylate and methacrylic acid (acid number 115),
- 5 pbw of 1,1,1-trimethylolethane triacrylate,
- 0.1 pbw of 1,4-bis-(isopropylamino)anthraquinone,
- 0.1 pbw of 9-(p-t-butylphenyl)-acridine,
- 0.1 pbw of leuco crystal violet,
- 0.1 pbw of 2-(4-ethoxynaphth-1-yl)-4,6-bis-trichloromethyl-s-triazine, and
- 0.1 pbw of 2,2-bis-(p-hydroxyphenyl)-propane-bis-2,3-epoxypropyl ether in
- 52 pbw of 2-methoxy-ethanol was applied to an electrolytically grained and anodized aluminum foil (dry layer weight 3 g/m²). The plate was then provided with a cover layer of polyvinyl alcohol (2 g/m²). The printing plate so prepared was exposed under an original to the light of a 5 kW metal halide lamp for 20 seconds and then treated with a developer comprising
- 15 pbw of sodium metasilicate×9 H₂O
- 3 pbw of polyglycol 6000,
- 0.6 pbw of levulinic acid, and
- 0.3 pbw of strontium hydroxide×8 H₂O in
- 1000 pbw of water by wiping over for one minute. In the process the unexposed layer areas were removed. The plate was thereafter inked with a black greasy ink. A printing test carried out with the offset printing form prepared in this manner was stopped after 100,000 faultless printed copies.

What is claimed is:
1. A photopolymerizable composition comprising:
   (a) a polymeric binder,
   (b) a compound having at least one terminal ethylenic double bond and a boiling point above about 100° C. at standard pressure and being capable of forming a polymer by free-radical initiated polymerization;
   (c) a photoinitiator,
   (d) a leuco dye, and
   (e) a leuco dye stabilizer comprising a compound having at least one epoxy group.
2. A photopolymerizable composition as claimed in claim 1, wherein the epoxy compound comprises a monoepoxy compound.

3. A photopolymerizable composition as claimed in claim 1, wherein the epoxy compound contains at least one epoxylated ether moiety.

4. A photopolymerizable composition as claimed in claim 2, wherein the epoxy compound comprises an epoxyalkyl ether.

5. A photopolymerizable composition as claimed in claim 1, wherein the epoxy compound comprises a glycidyl ether.

6. A photopolymerizable composition as claimed in claim 1, wherein the epoxy compound comprises at least one aromatic ring.

7. A photopolymerizable composition as claimed in claim 1, wherein the epoxy compound comprises a compound having a molecular weight not greater than about 600.

8. A photopolymerizable composition as claimed in claim 1, wherein the epoxy compound comprises a compound having a molecular weight not greater than about 400.

9. A photopolymerizable composition as claimed in claim 1, which comprises from about 0.05 to about 2 percent by weight of epoxy compound, based on the nonvolatile constituents of the composition.

10. A photopolymerizable composition as claimed in claim 1, wherein the leuco dye comprises a triphenylmethane dye or a xanthene dye.

11. A photopolymerizable composition as claimed in claim 1, further comprising a photooxidizing agent.

12. A photopolymerizable composition as claimed in claim 1, wherein the photooxidizing agent comprises a compound having at least one trihalogenomethyl substituent or a dihalogenated methylene group.

13. A photopolymerizable recording material comprising a support and a photopolymerizable layer that comprises:
  (a) a polymeric binder;
  (b) a compound having at least one terminal ethylenic double bond and a boiling point above about 100° C. at standard pressure and being capable of forming a polymer by free-radical initiated polymerization;
  (c) a photoinitiator,
  (d) a leuco dye, and
  (e) a leuco dye stabilizer comprising a compound having at least one epoxy group.

14. A photopolymerizable recording material as claimed in claim 13, wherein the epoxy compound comprises a monoepoxy compound.

15. A photopolymerizable recording material as claimed in claim 13, wherein the epoxy compound contains at least one epoxylated ether moiety.

16. A photopolymerizable recording material as claimed in claim 14, wherein the epoxy compound comprises an epoxyalkyl ether.

17. A photopolymerizable recording material as claimed in claim 13, wherein the epoxy compound comprises a glycidyl ether.

18. A photopolymerizable recording material as claimed in claim 13, wherein the epoxy compound comprises at least one aromatic ring.

19. A photopolymerizable recording material as claimed in claim 13, wherein the epoxy compound comprises a compound having a molecular weight not greater than about 600.

20. A photopolymerizable recording material as claimed in claim 13, wherein the epoxy compound comprises a compound having a molecular weight not greater than about 400.

21. A photopolymerizable recording material as claimed in claim 13, which comprises from about 0.05 to about 2 percent by weight of epoxy compound, based on the non-volatile constituents of the composition.

22. A photopolymerizable recording material as claimed in claim 13, wherein the leuco dye comprises a triphenylmethane dye or a xanthene dye.

23. A photopolymerizable recording material as claimed in claim 13, further comprising a photooxidizing agent.

24. A photopolymerizable recording material as claimed in claim 13, wherein the photooxidizing agent comprises a compound having at least one trihalogenomethyl substituent or a dihalogenated methylene group.

25. A photopolymerizable recording material as claimed in claim 13, wherein the support comprises a transparent plastic film.

26. A photopolymerizable recording material as claimed in claim 13, wherein the support has a surface comprising copper, aluminum, zinc, copper alloy, aluminum alloy, zinc alloy or steel.

27. A photopolymerizable recording material as claimed in claim 13, wherein the support comprises a perlon gauze.

* * * * *